(12) United States Patent
Ku et al.

(10) Patent No.: US 10,872,924 B2
(45) Date of Patent: Dec. 22, 2020

(54) MICROARRAY AND METHOD FOR FORMING THE SAME

(71) Applicant: Centrillion Technologies Taiwan Co. LTD., Hsinchu County (TW)

(72) Inventors: Tzu-Kun Ku, Hsinchu County (TW); Yao-Kuang Chung, Hsinchu County (TW); Chun-Hao Chang, Hsinchu County (TW)

(73) Assignee: Centrillion Technologies Taiwan Co. LTD., Hsinchu County (TW)

( * ) Notice: Subject to any disclaimer, the term of this patent is extended or adjusted under 35 U.S.C. 154(b) by 0 days.

(21) Appl. No.: 16/200,659

(22) Filed: Nov. 27, 2018

(65) Prior Publication Data
US 2019/0165039 A1 May 30, 2019

Related U.S. Application Data

(60) Provisional application No. 62/590,657, filed on Nov. 27, 2017.

(51) Int. Cl.
*H01L 27/15* (2006.01)
*H01L 33/58* (2010.01)
(Continued)

(52) U.S. Cl.
CPC ........ *H01L 27/156* (2013.01); *H01L 25/0753* (2013.01); *H01L 33/0095* (2013.01);
(Continued)

(58) Field of Classification Search
CPC ....... H01L 27/156; H01L 33/56; H01L 33/58; H01L 33/0095; H01L 25/0753
(Continued)

(56) References Cited

U.S. PATENT DOCUMENTS 6,800,438 B2 * 10/2004 Noolandi ........... G01N 15/1425
204/155
7,053,198 B2 5/2006 Goldberg et al.
(Continued)

FOREIGN PATENT DOCUMENTS

CN 1413126 4/2003
CN 1726432 1/2006
(Continued)

OTHER PUBLICATIONS

"Office Action of Taiwan Counterpart Application", dated May 10, 2019, pp. 1-4.
(Continued)

*Primary Examiner* — Igwe U Anya
(74) *Attorney, Agent, or Firm* — JCIPRNET

(57) ABSTRACT

A microarray and a method for forming the same are disclosed and the method includes the following steps. A solid matrix and a micro LED array is provided, wherein the solid matrix comprises a plurality of areas corresponding to a plurality of LEDs of the micro LED array. A monomer with a photolabile protecting group is formed in the plurality of areas respectively. At least one of the plurality of areas is irradiated by turning on the corresponding LED of the micro LED array, so as to eliminate the photolabile protecting group of the monomer in the at least one of the plurality of areas. A monomer is conjugated to the deprotected monomer in the at least one of the plurality of areas. The steps of irradiating and conjugating are repeated, so as to form probes in the plurality of areas respectively.

14 Claims, 20 Drawing Sheets

(51) Int. Cl.
  *H01L 33/56* (2010.01)
  *H01L 33/00* (2010.01)
  *H01L 23/00* (2006.01)
  *H01L 25/075* (2006.01)

(52) U.S. Cl.
  CPC .............. *H01L 33/56* (2013.01); *H01L 33/58* (2013.01); *H01L 24/95* (2013.01); *H01L 2924/12041* (2013.01); *H01L 2933/005* (2013.01); *H01L 2933/0058* (2013.01)

(58) Field of Classification Search
  USPC .......................................................... 257/88
  See application file for complete search history.

(56) References Cited

U.S. PATENT DOCUMENTS

| | | | |
|---|---|---|---|
| 2009/0023609 A1* | 1/2009 | Jung | B01J 19/0046 506/32 |
| 2009/0075843 A1* | 3/2009 | Jiang | C40B 60/12 506/39 |
| 2011/0045515 A1* | 2/2011 | Bell | C12Q 1/37 435/15 |
| 2017/0242160 A1* | 8/2017 | Zhang | G02B 3/0018 |
| 2019/0003971 A1* | 1/2019 | Cao | G01N 21/6428 |

FOREIGN PATENT DOCUMENTS

| | | |
|---|---|---|
| CN | 101104954 | 1/2008 |
| CN | 101221121 | 7/2008 |
| CN | 101963762 | 2/2011 |
| TW | 201732299 | 9/2017 |
| TW | 201740358 | 11/2017 |

OTHER PUBLICATIONS

O. Srivannavit, et al., "Microfluidic reactor array device for massively parallel in situ synthesis of oligonucleotides," Sensors and Actuators B Chemical, May 2009, pp. 473-481.

O. Srivannavit, et al., "Design and fabrication of microwell array chips for a solution-based, photogenerated acid-catalyzed parallel oligonuclotide DNA synthesis," Sensors and Actuators A Physical, Jun. 2004, pp. 150-160.

Sarah Blair, et al., "A scalable method for multiplex LED-controlled synthesis of DNA in capillaries," Nucleic Acids Research, vol. 34, Sep. 2006, pp. 1-8.

Jean Philippe Pellois, et al., "Individually addressable parallel peptide synthesis on microchips," Nature Biotechnology volume, vol. 20, Jul. 2002, pp. 922-926.

"Office Action of China Counterpart Application", dated Aug. 13, 2020, pp. 1-8.

* cited by examiner

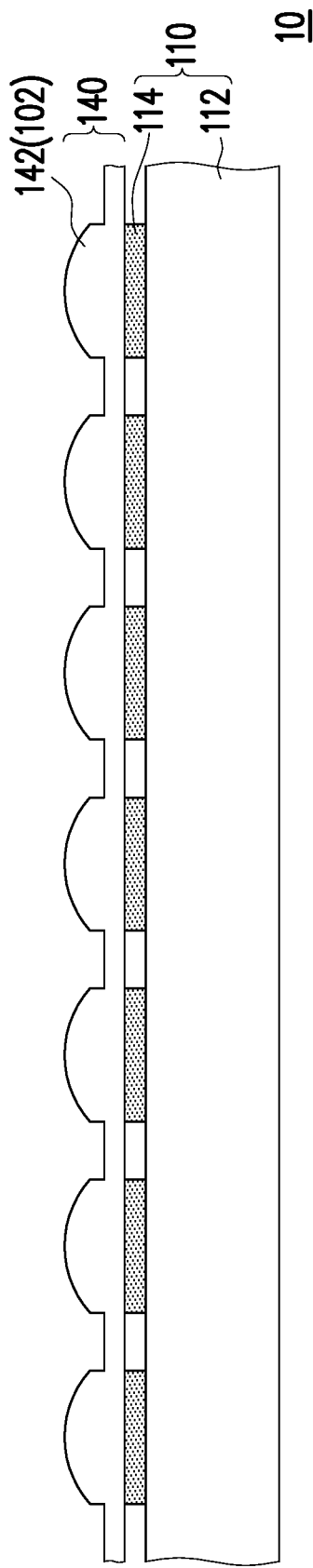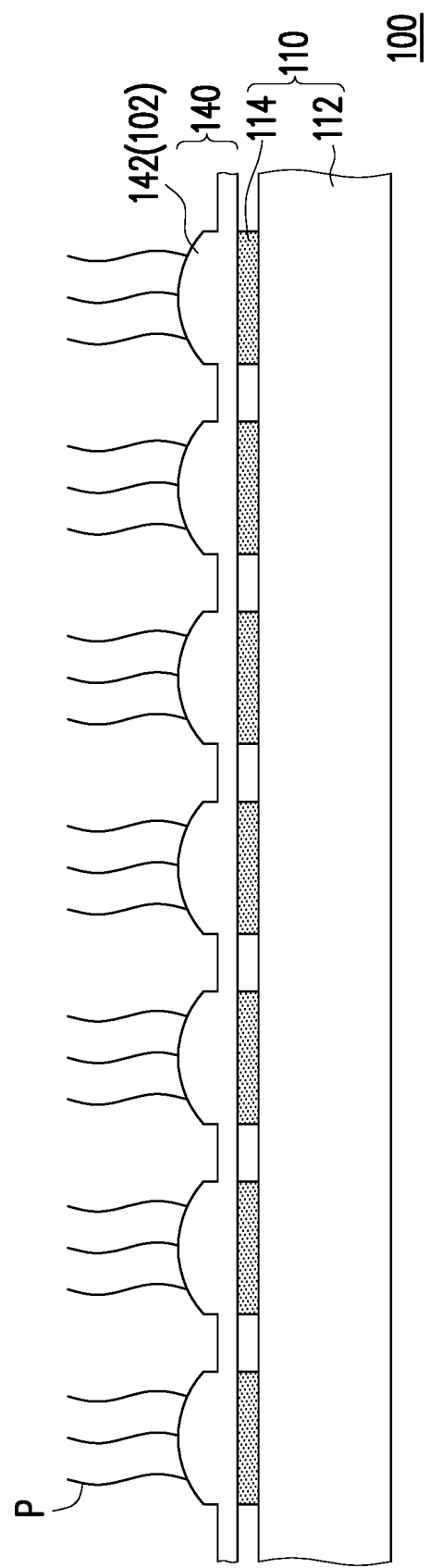

MICROARRAY AND METHOD FOR FORMING THE SAME

CROSS REFERENCE TO RELATED APPLICATION

This application claims the priority benefit of U.S. provisional application Ser. No. 62/590,657, filed on Nov. 27, 2017. The entirety of the above-mentioned patent application is hereby incorporated by reference herein and made a part of specification.

BACKGROUND OF THE INVENTION

Field of the Invention

The invention relates to a microarray and a method for forming the same, in particular, to a microarray and a method for forming the same without using masks.

Description of Related Art

A microarray including synthesized probes is widely used in the study of genetics, proteomics, pharmaceutical research and clinical detection. In order to obtain the detection results of the microarray with high accuracy and reliability, the quality of the microarray, that is, the quality of the synthesized probes, is important.

Currently, the probes of the microarray may be formed on the solid matrix by photosynthesis. In order to form a plurality of probes on the solid matrix, a huge number of different and dedicated masks is used, and thus there is a need for changing masks during the photosynthesis. However, the masks are expansive and changing of the masks is time-consuming, and the cost of forming the microarray is expensive.

SUMMARY OF THE INVENTION

The invention provides a method for forming a microarray without using masks.

The invention further provides a microarray which is incorporated with a micro LED array.

In an embodiment of the invention, a method for forming a microarray includes following steps. A solid matrix and a micro LED array is provided, wherein the solid matrix comprises a plurality of areas corresponding to a plurality of LEDs of the micro LED array. A monomer with a photolabile protecting group is formed in the plurality of areas respectively. At least one of the plurality of areas is irradiated by turning on the corresponding LED of the micro LED array, so as to eliminate the photolabile protecting group of the monomer in the at least one of the plurality of areas. A monomer is conjugated to the deprotected monomer in the at least one of the plurality of areas. The steps of irradiating and conjugating are repeated, so as to form probes in the plurality of areas respectively.

In an embodiment of the invention, a linker is further formed between the solid matrix and the monomer with the photolabile protecting group.

In an embodiment of the invention, the step of forming the monomer with the photolabile protecting group in the plurality of areas respectively comprising: forming a linker with a photolabile protecting group in the plurality of areas respectively; irradiating at least one of the plurality of areas by turning on the corresponding LED of the micro LED array, so as to eliminate the photolabile protecting group of the linker in the at least one of the plurality of areas; and conjugating the monomer with the photolabile protecting group to the deprotected linker in the at least one of the plurality of areas.

In an embodiment of the invention, the steps of irradiating and conjugating comprise: irradiating a first set of the plurality of areas by turning on the corresponding LED of the micro LED array, so as to eliminate the photolabile protecting group of the linker or monomer in the first set of the plurality of areas; and conjugating a first monomer to the deprotected linker or monomer in the first set of the plurality of areas.

In an embodiment of the invention, the method further comprises: irradiating a second set different from the first set of the plurality of areas by turning on the corresponding LED of the micro LED array, so as to eliminate the photolabile protecting group of the linker or monomer in the second set of the plurality of areas; and conjugating a second monomer different from the first monomer to the deprotected linker or monomer in the second set of the plurality of areas.

In an embodiment of the invention, the micro LED array is disposed above a surface of the solid matrix on which the probe is formed.

In an embodiment of the invention, the plurality of areas of the solid matrix are directly disposed over the plurality of LEDs of the micro LED array respectively.

In an embodiment of the invention, the solid matrix comprises a plurality of patterns respectively disposed in the plurality of areas.

In an embodiment of the invention, a surface of the solid matrix is salinized.

In an embodiment of the invention, the method further comprises: forming a light-blocking separation between the plurality of areas of the solid matrix.

In an embodiment of the invention, the monomer is a nucleotide or an amino acid.

In an embodiment of the invention, the method further comprises: disposing a microlens array between the solid matrix and the micro LED array, wherein the microlens array are disposed correspondingly to the plurality of areas of the solid matrix.

In an embodiment of the invention, the method further comprises: aligning the plurality of areas of the solid matrix and the plurality of LEDs of the micro LED array.

In an embodiment of the invention, the solid matrix is a microlens array disposed over the micro LED array.

In an embodiment of the invention, a microarray includes a micro LED array, a solid matrix and a plurality of probes. The micro LED array comprises a plurality of LEDs. The solid matrix is disposed over the micro LED array, and comprises a plurality of areas corresponding to the plurality of LEDs. The probes are respectively disposed in the plurality of areas.

In an embodiment of the invention, the plurality of areas of the solid matrix are directly disposed over the plurality of LEDs of the micro LED array respectively.

In an embodiment of the invention, the microarray further comprises a light-blocking separation between the plurality of areas of the solid matrix.

In an embodiment of the invention, the solid matrix comprises a plurality of patterns respectively disposed in the plurality of areas.

In an embodiment of the invention, the microarray further comprises a microlens array between the solid matrix and the micro LED array, wherein the microlens array are disposed correspondingly to the plurality of areas of the solid matrix.

In an embodiment of the invention, the solid matrix is a microlens disposed over the micro LED array.

Based on the above, the invention provides a method for forming a microarray without using masks. The areas of the solid matrix are selectively irradiated by turning on the corresponding LEDs of the micro LED array, and thus the photolabile protecting group of the linker or monomer in the irradiated area is eliminated while the photolabile protecting group of the linker or monomer in the unirradiated area is retained. Accordingly, a coming monomer may be specifically conjugated to the deprotected linker or monomer rather than to the protected linker or monomer. Therefore, a probe with a desired sequence may be formed in a desired area. Furthermore, by using the micro LED array, the masks are not required, and thus cost for forming a microarray may be significantly reduced.

In order to make the aforementioned features and advantages of the invention more comprehensible, embodiments are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A and 3B respectively illustrate an equipment for forming a microarray and a microarray formed by using the equipment according to some embodiments of the invention.

DESCRIPTION OF THE EMBODIMENTS

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

Figure 1A:
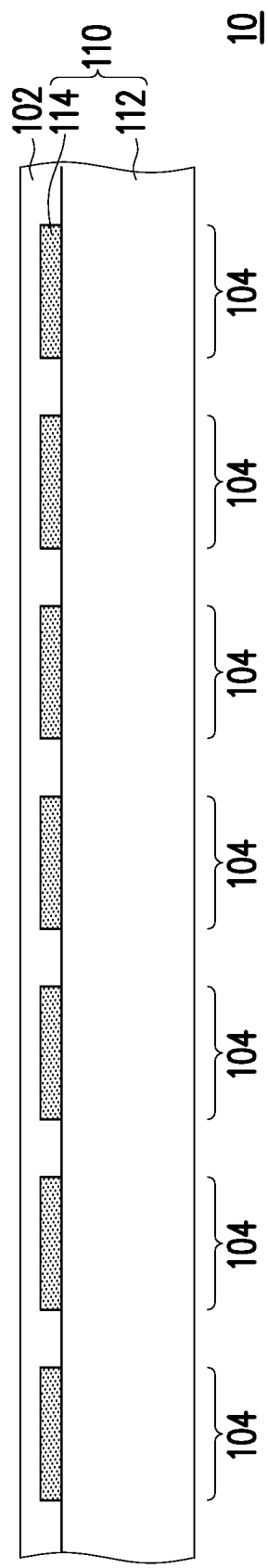
FIGS. 1A to 1K illustrate a method for forming a microarray according to some embodiments of the invention.

FIGS. 1A to 1K illustrate a method for forming a microarray according to some embodiments of the invention. Referring to FIG. 1A, an equipment 10 for forming a microarray is provided. In some embodiments, the equipment 10 includes a solid matrix 102 and a micro LED array 110. In some embodiments, the solid matrix 102 includes a plurality of areas 104 corresponding to a plurality of LEDs 114 of the micro LED array 110. In some embodiments, the solid matrix 102 is formed on a top surface of the micro LED array 110, that is, top surfaces of the LEDs 114. The solid matrix 102 may be formed on the top surface of the micro LED array 110 and has a substantially planar surface, for example. In other words, the solid matrix 102 may be further formed into the gaps between the LEDs 114, and the solid matrix 102 substantially covers an entire exposed surface of the LEDs 114. In some embodiments, a material of the solid matrix 102 is silicon oxide or other suitable material and the solid matrix 102 may be formed by a deposition process such as a chemical vapor deposition, for example. In some embodiments, the areas 104 of the solid matrix 102 are arranged in an array and respectively disposed on the top surfaces of the LEDs 114. To be specific, the areas 104 of the solid matrix 102 may be substantially the regions irradiated by the LEDs 114. In some embodiments, a size of the area 104 may be 10 μm×10 μm or less, for example.

In some embodiments, the micro LED array 110 includes a substrate 112 and the LEDs 114 arranged in an array on the substrate 112. The substrate 112 may be a semiconductor substrate such as a sapphire substrate, and the LED 114 may include a n-type semiconductor layer, a n-type electrode electrically connected to the n-type semiconductor layer, a p-type semiconductor layer, a p-type electrode electrically connected to the p-type semiconductor layer and other suitable layers. In some embodiments, the lights emitted from the LEDs 114 respectively irradiate corresponding area 104 of the solid matrix 102. In some embodiments, the lights emitted from the LEDs 114 irradiate the areas 104 of the solid matrix 102 from the backside of the solid matrix 102, which is opposite to the front side of the solid matrix 102 on which the probes are formed. The lights emitted from the LEDs 114 may be EUV light, deep UV light or other suitable light. In some embodiments, the lights have a suitable wavelength ranging from 200 to 500 nm such as 405 nm or 365 nm based on the photolabile protecting group to be eliminated.

In some embodiments, in order to drive the micro LED array 110, the micro LED array 110 and a driver (not shown) may be integrated on and electrically connected to a printed circuit board (PCB) (not shown), so as to form a package. In some embodiments, the micro LED array 110 may be an active matrix LED array or a passive matrix LED array. The PCB may be further electrically connected to a microcontroller (not shown), and thus the LEDs of the micro LED array 110 may be individually controlled, that is, individually turned on and off. In addition, in order to carry out the photosynthesis, the micro LED array 110 with the solid matrix 102 thereon may be disposed in a flow cell including a cover and a base. The micro LED array 110 with the solid matrix 102 thereon may be disposed in a trench of the base and is covered by the cover. In some embodiments, after the micro LED array 110 with the solid matrix 102 thereon is disposed between the cover and the base, a sealing part is disposed between the cover and the substrate 112 of the micro LED array 110 to seal the solid matrix 102. Accordingly, the solid matrix 102 is disposed in a closed space. In some embodiments, an inlet and an outlet may be configured in the cover, and thus the reaction solutions for the photosynthesis may be flowed into and out of the closed space to be in contact with the solid matrix 102 of the micro LED array 110, so as to carry out the photosynthesis efficiently on the solid matrix 102. A material of the cover, the base and the sealing part is anti-corrosion material such as plastic or quartz. In addition, a fastener such as a screw may be inserted into the cover and the base to secure the flow cell.

In some embodiments, a silanization process may be performed on the surface of the solid matrix 102 to form a silanized surface for immobilizing the probe. In some embodiments, the silanization process includes adding alkoxysilane onto the surface of the solid matrix 102. Alkoxysilane includes aminosilane, glycidoxysilane and mercaptosilane, for example. In some alternative embodiments, the surface of the solid matrix 102 may be modified by a modifier, which may be selected from silanol, polylysine and alkoxysilane, for example.

In some alternative embodiments, the top surface of the micro LED array 110 (i.e., the top surfaces of the LEDs 114) may be suitable to be silanized, and thus the top surface of the micro LED array 110 may directly serve as the solid matrix. Accordingly, the solid matrix may be omitted and not required to being additionally provided, for example. For example, when the top surface of the micro LED array 110 is a polymer surface such as a plastic surface, an oxygen plasma process and a silanization process may be sequentially performed thereon to form a silanized surface.

Figure 1B:
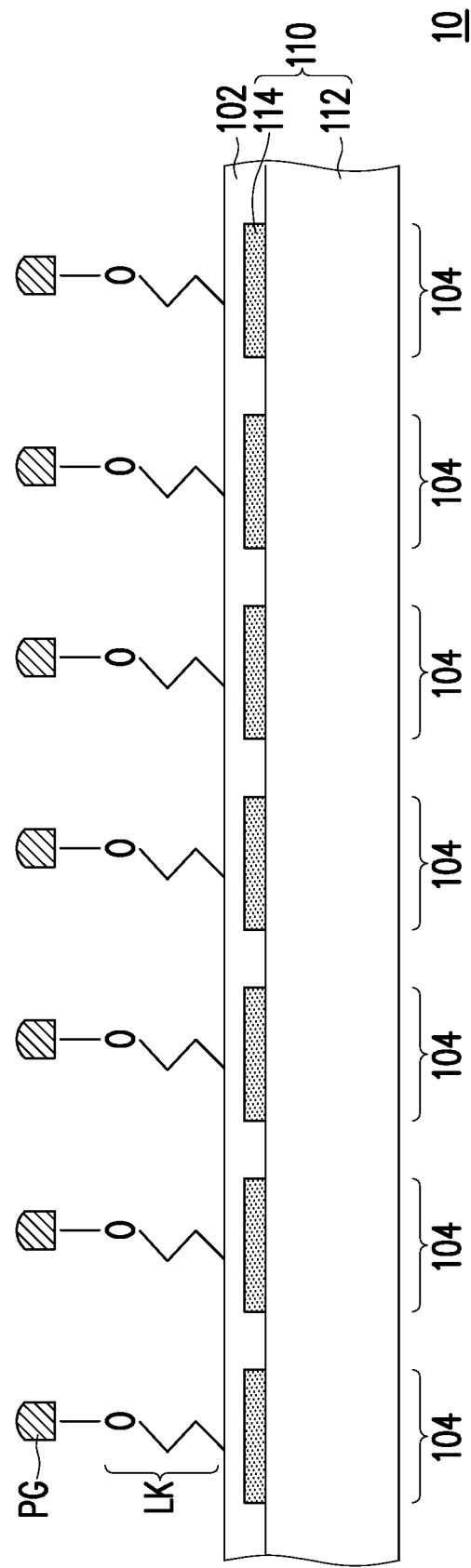

Referring to FIG. 1B, a linker LK is formed in the areas 104 of the solid matrix 102 respectively. In some embodiments, the linker LK is bonded to the silanized surface of the areas 104 of the solid matrix 102. In some embodiments, the linker LK is capped with a photolabile protecting group PG at its end. The linker LK and the photolabile protecting group PG are covalently bonded by an oxygen group (—O—), for example. The linker LK may be polyethyleneglycol (PEG), phosphoramidite or other suitable group, and the photolabile protecting group PG is a 2-(2-nitrophenyl)propoxycarbonyl (NPPOC) group, α-methyl-2-nitropiperonyloxycarbonyl (MeNPOC) group, thiophenyl-2-(2nitrophenyl)-propoxycarbonyl (SPh-NPPOC) group, 2-(3, 4methylenedioxy-6-nitrophenyl)propoxycarbonyl (MNPPOC) group, 6-nitroveratryloxycarbonyl (NVOC) group, Dimethoxybenzoincarbonate (DMBOC) group, 4,4'-Dimethoxytrityl (DMT) group, or their derivatives thereof such as or the like. For clarity, only one linker is illustrated in one area 104, however, a plurality of linkers may be formed in one area 104, and therefore a plurality of probes may be formed in one area 104.

Figure 1C:
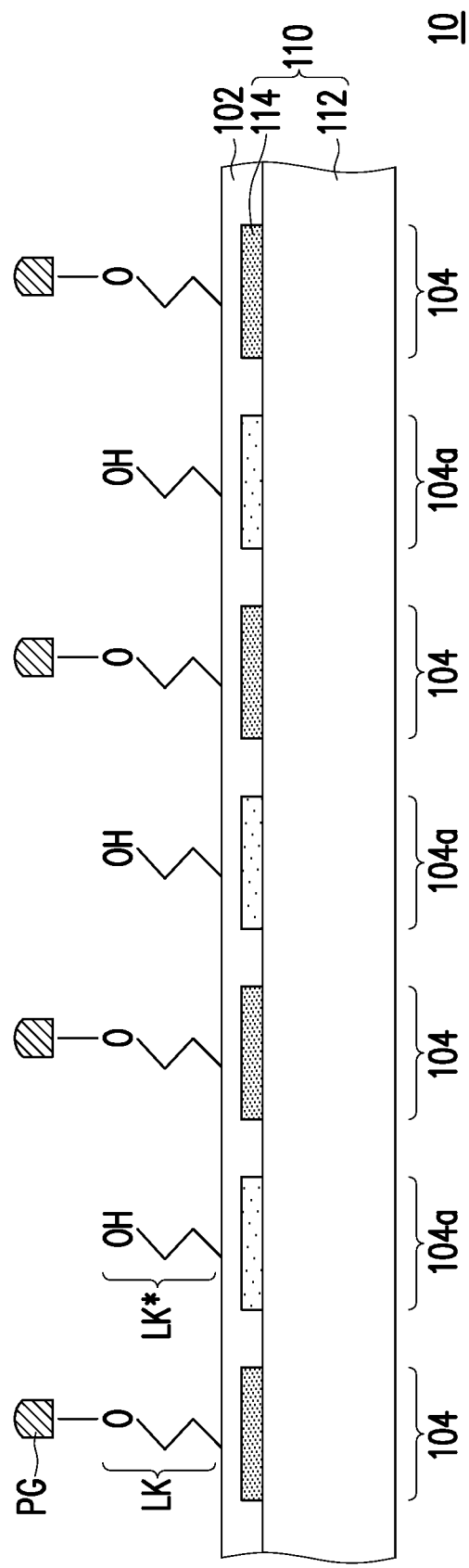
Figure 1D:
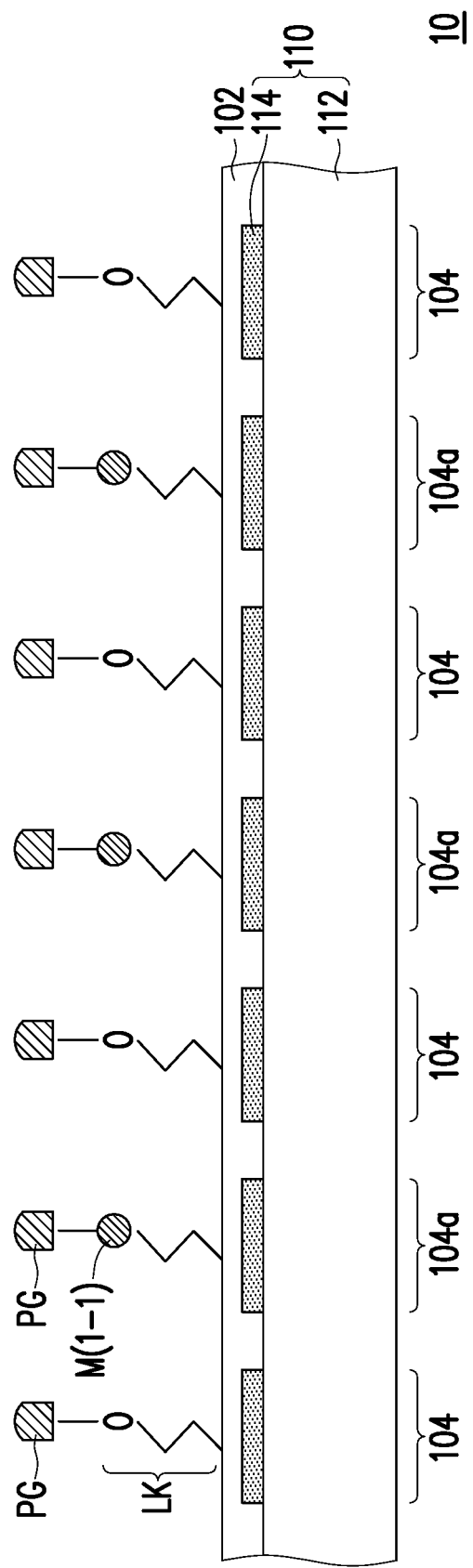

Referring to FIGS. 1C and 1D, a cycle including a selective irradiation step and a monomer addition step is performed onto at least one selected area 104a of the solid matrix 102. First, as shown in FIG. 1C, a first set of areas 104a of the solid matrix 102 are selected to be irradiated by turning on the corresponding LEDs 114 of the micro LED array 110, so that the photolabile protecting group PG in the selected area 104a is eliminated from the linker LK to form a deprotected linker LK*. In some embodiments, the selected areas 104a (i.e., the irradiated areas 104a) are irradiated by turning on the corresponding LEDs 114 of the micro LED array 110 while the unselected areas 104 (i.e., the unirradiated areas 104) are not irradiated by turning off the corresponding LEDs 114. In some embodiments, after the photolabile protecting group PG is removed, the deprotected linker LK* has and exposes a hydroxyl group at its end, for example.

Referring to FIG. 1D, a monomer addition step is performed in the selected areas 104a. In some embodiments, after the selective irradiation step is finished, the LEDs 114 of the micro LED array 110 corresponding to the selected areas 104a (i.e., the irradiated areas 104a) are turned off. In some embodiments, the monomer is also referred to as a building block or a basic unit of a probe, and the monomer may be a nucleotide, an amino acid and so on. In some embodiments, a monomer M(1-1) capped with a photolabile protecting group PG is conjugated to the deprotected linker LK* in the selected area 104a. Since the linkers LK in the unselected areas 104 (i.e., the unirradiated areas 104) are still blocked by the photolabile protecting group PG, the monomer M(1-1) is merely bonded to the deprotected linker LK* in the selected areas 104a (i.e., the irradiated areas 104a). In some embodiments, the monomer M(1-1) is directly conjugated to the linker, and thus the monomer M(1-1) is also referred to the first monomer of the probe in the selected areas 104a. In some embodiments, the first monomers in the selected areas 104a are the same and simultaneously formed. In other words, the first monomers of the same type (for example, dTTP) are formed simultaneously by a cycle including selective irradiation step and monomer addition step.

In some embodiments, as the probe is ss-DNA, DNA aptamer or the like, the monomer M(1-1) is a deoxynucleotide (dNTP) selected from dATP, dCTP, dGTP and dTTP, and the protecting group is a 2-(2-nitrophenyl)propoxycarbonyl (NPPOC) group, α-methyl-2-nitropiperonyloxycarbonyl (MeNPOC) group, thiophenyl-2-(2nitrophenyl)-propoxycarbonyl (SPh-NPPOC) group, 2-(3, 4methylenedioxy-6-nitrophenyl)propoxycarbonyl (MNPPOC) group, 6-nitroveratryloxycarbonyl (NVOC) group, Dimethoxybenzoincarbonate (DMBOC) group, 4,4'-Dimethoxytrityl (DMT) group, or their derivatives thereof such as or the like. In some embodiments, as the probe is miRNA, RNA aptamer or the like, the monomer M(1-1) is a nucleotide (NTP) selected from ATP, CTP, GTP and UTP, and the protecting group is a NPPOC group, MeNPOC group, SPh-NPPOC group, MNPPOC group, NVOC group, DMBOC group, or DMT group and their derivative thereof such as or the like. In some embodiments, as the probe is peptide, protein, aptamer, antibody or the like, the monomer M(1-1) is an amino acid selected from Ala, Arg, Asn, Asp, Cys, Glu, Gln, Gly, His, Ile, Leu, Lys, Met, Phe, Pro, Ser, Thr, Trp, Tyn, and Val, and the protecting group is a tert-butyloxycarbonyl (t-Boc) group, the derivative thereof such as or the like.

Figure 1E:
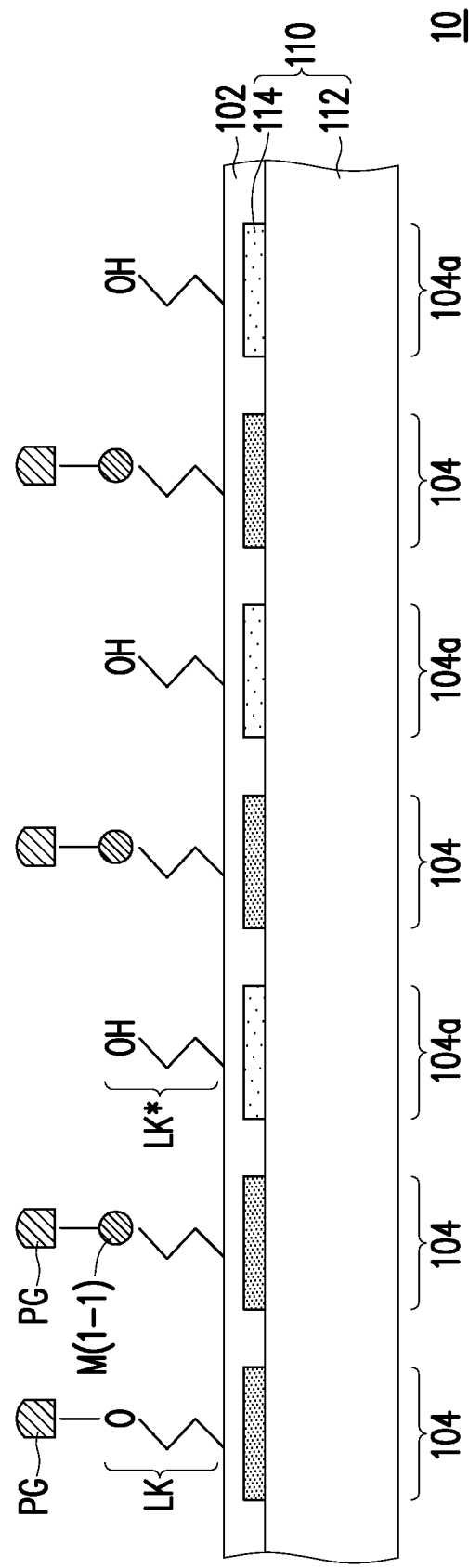
Figure 1F:
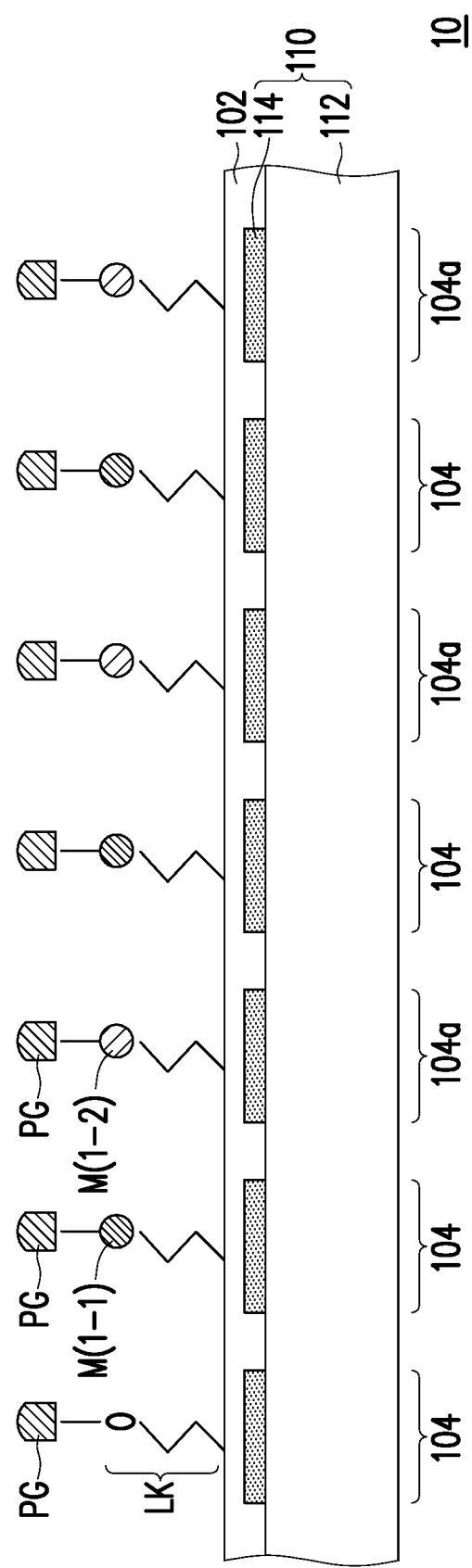

Referring to FIGS. 1E and 1F, then, a cycle including selective irradiation step and monomer addition step is performed onto at least one selected area 104a. In some embodiments, a second set of areas 104a different from the first set of areas 104a is selected for adding a monomer M(1-2) of a second type different from the first type. That is, the first monomer (i.e., the monomer M(1-2)) of the probes in the first set of areas is different from the first monomer (i.e., the monomer M(1-1)) of the probes in the second set of areas. First, as shown in FIG. 1E, the second set of areas 104a are selected to be irradiated by turning on the corresponding LEDs 114 of the micro LED array 110, so that the photolabile protecting group PG in the selected area 104a is eliminated from the linker LK to form a deprotected linker LK*. Then, as shown in FIG. 1F, a monomer M(1-2) capped with a photolabile protecting group PG is conjugated to the deprotected linker LK* in the selected area 104a.

Figure 1G:
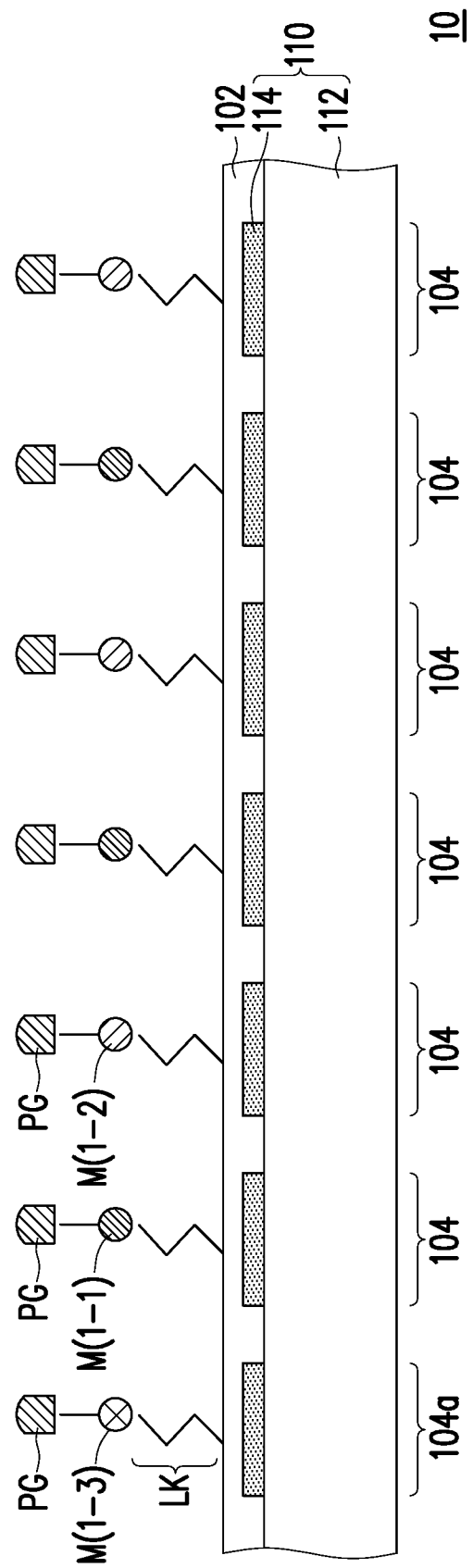

Referring to FIG. 1G, in some embodiments, a cycle including selective irradiation step and monomer addition step is performed onto a third set of area(s) 104a, and a monomer M(1-3) is bonded to the linker in the area(s) 104a. The monomers M(1-1)-M(1-3) are different from one another. In some embodiments, the first monomers of the probes on the solid matrix may be divided into three types (for example, three of dATP, dCTP, dGTP and dTTP), and thus the areas 104 are divided into three sets (for example, first to third set of areas) and the cycle including selective irradiation step and monomer addition step is performed three times. In other words, the number of the sets of the areas and the cycles is equal to the number of the types of the first monomers of the probes. In some alternative embodiments, the cycle including selective irradiation step and monomer addition step may be performed once, that is, the first monomers of all probes are the same, and all LEDs in the micro LED array are turned on, and the monomers are bonded to the deprotected linkers in all areas, for example.

Figure 1H:
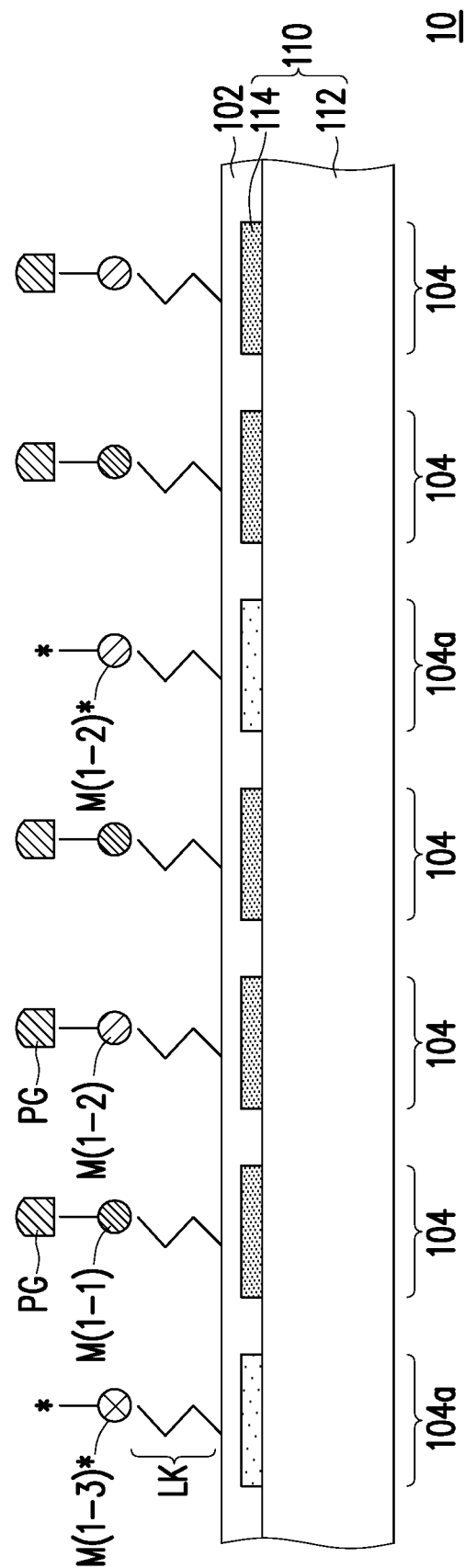
Figure 1I:
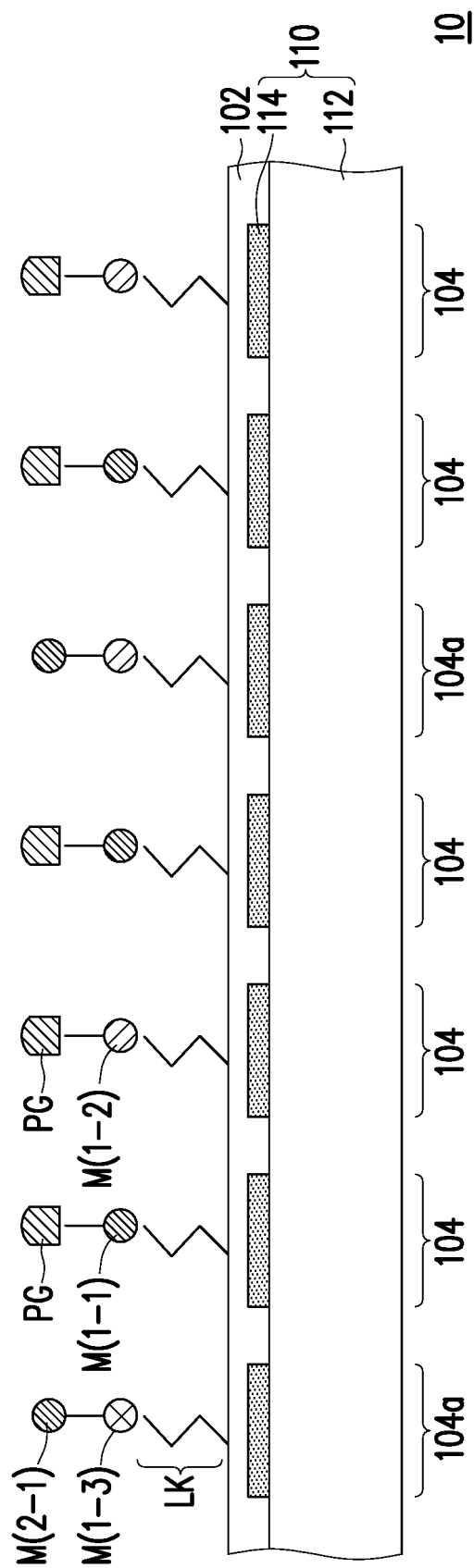

After all of the first monomers of the probes are formed, processes of forming the second monomers of the probes are performed. Referring to FIGS. 1H and 1I, a cycle including selective irradiation step and monomer addition step is performed onto at least one selected area 104a for forming the second monomer(s) of the same type. In some embodiments, a set of areas 104a are selected to form the second monomers of the same type. First, as shown in FIG. 1H, the selected areas 104a are irradiated by turning on the corresponding LEDs 114 of the micro LED array 110, so that the photolabile protecting group PG is eliminated from the monomer such as the monomers M(1-2), M(1-3) in the selected area 104a to form a deprotected monomer such as deprotected monomers M(1-2)*, M(1-3)*. In some embodiments, the photolabile protecting group PG capped on the monomers M(1-1)-M(1-3) may be eliminated by a light having the same or similar wavelength, and thus they may be removed by the same irradiation step. Then, as shown in FIG. 1I, a monomer M(2-1) capped with a photolabile protecting group PG is conjugated to the deprotected monomer such as deprotected monomers M(1-2)*, M(1-3)* in the selected area 104a. In some embodiments, the monomer M(2-1) is a dNTP selected from dATP, dCTP, dGTP and dTTP, for example. In some embodiments, the monomer M(2-1) may be the same or different from the monomer M(1-1).

Figure 1J:
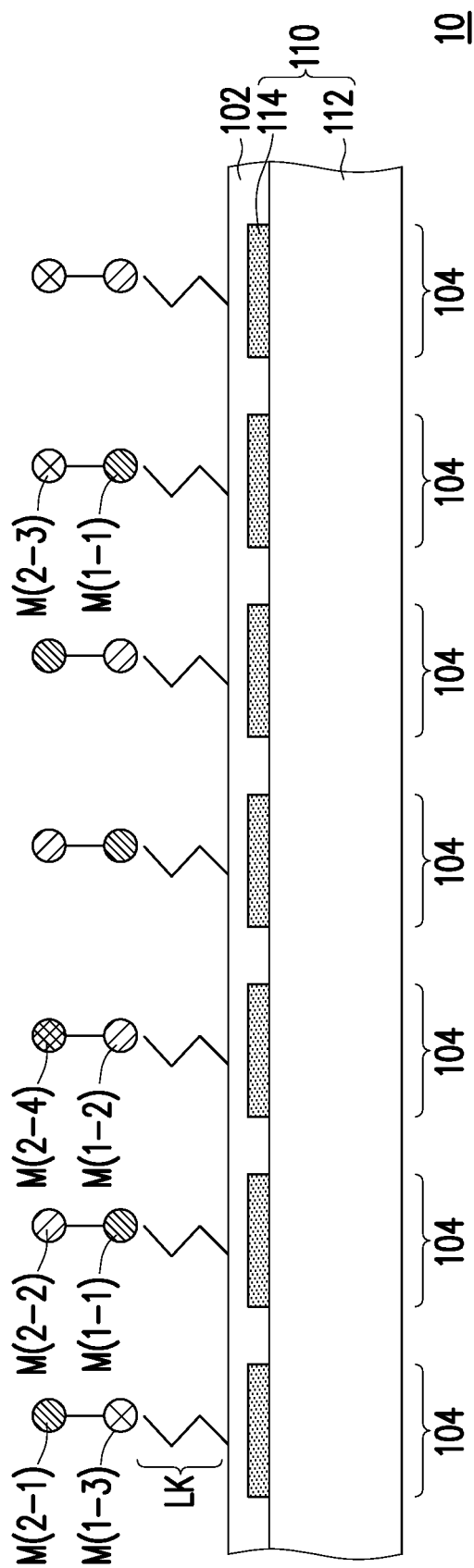

Referring to FIG. 1J, the second monomers M(2-2)-M(2-4) of the probes are sequentially formed by repeating a cycle including selective irradiation step and monomer addition step. As mentioned before, the total number of the cycle of including selective irradiation step and monomer addition step is determined according to the type(s) of the second monomers M(2-1)-M(2-4) of the probes. In some embodiments, as the monomer is a dNTP, the total types of the second monomers of the probes may be 4, that is, the second monomers of the probes include dATP, dCTP, dGTP and dTTP. However, in some alternative embodiments, as the monomer is a dNTP, the total type(s) of the second monomers of the probes may be 1, 2 or 3, that is, the second monomers of the probes include one, two or three of dATP, dCTP, dGTP and dTTP.

In other words, for forming the n-th monomers M(n-1) . . . M(n-(x-2)), M(n-(x-1)), M(n-x) of the probes P, the cycles for forming the monomers M(n-1)-M(n-x) are sequentially and separately performed, in which x is the number of the total types of the n-th monomers M(n-1)-M(n-x) of the probes P and also the number of the total cycles for forming the n-th monomers M(n-1)-M(n-x) of the probes P. In each cycle, at least one area is selected.

Figure 1K:
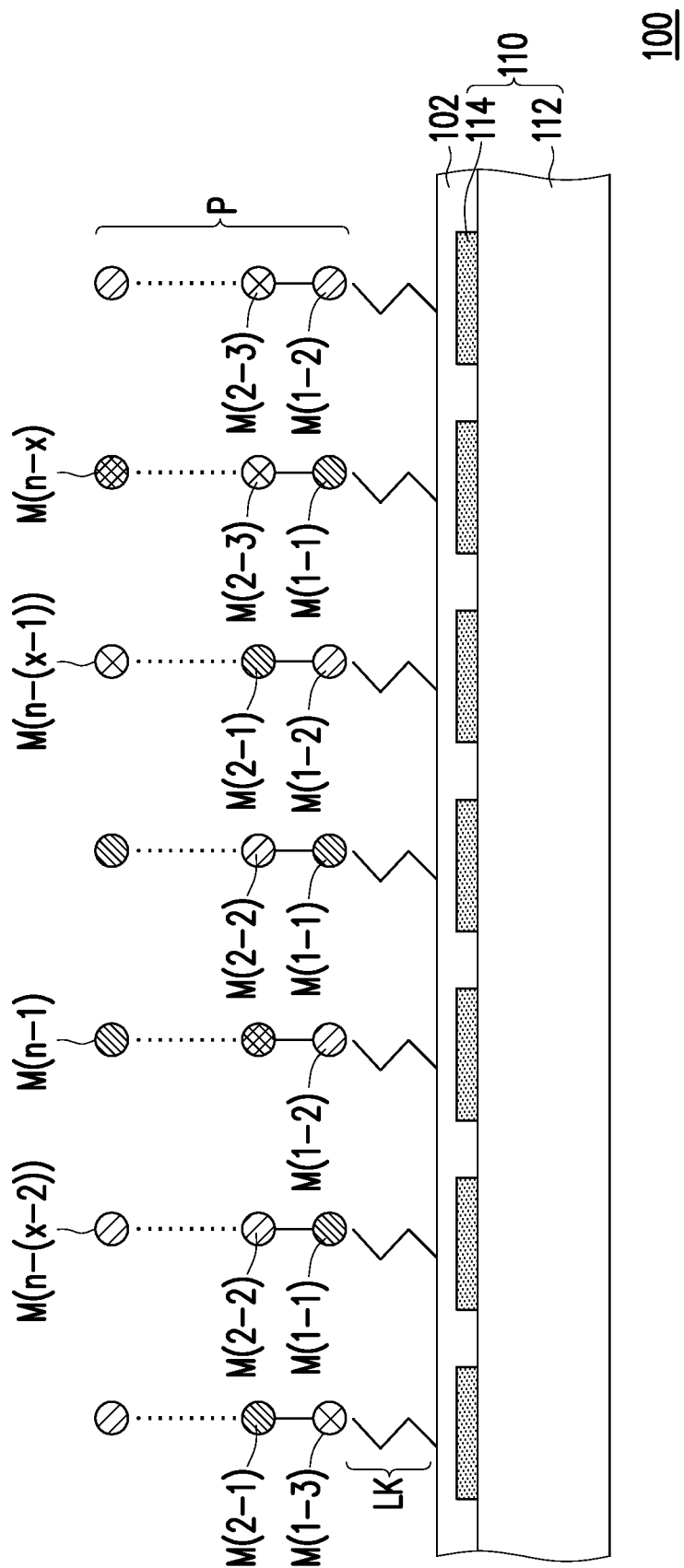

Referring to FIG. 1K, after performing several cycles of the selective irradiation step and monomer addition step, the probes P are respectively formed in the areas 104. In some embodiments, depending on a desired total number (i.e., N ranging from 1 to 100) of monomers in one probe P in the area 104, the cycle including selective irradiation step and monomer addition step is repeated several times (i.e., N) to form one probe P. In some embodiments, the performed cycles are substantially the same except that the N-th monomer (i.e., the last monomer) of the probe P is added without being capped with a photolabile protecting group.

In some embodiments, the formed microarray 100 includes the micro LED array 110, the solid matrix 102 and a plurality of probes P. In some embodiments, the probes P are respectively disposed in the areas 104 of the solid matrix 102. For clarity, only one probe P is illustrated in one area 104, however, a plurality of probes P having the same sequence may be formed in one area 104. In some embodiments, the probes P in one area 104 may have different sequence from the probes in another area 104.

In some embodiments, by using the micro LED array 110, the probes P may be directly formed in the areas 104 by an in-situ photosynthesis without using masks. Since the masks are not required, the cost for making the masks and the time for aligning the mask and the matrix and changing the masks during photosynthesis are omitted, and cost and time for forming the probes is significantly decreased. In addition, the probes in the boundary between the areas or the probes with undesired sequence in the area caused by the variation in mask alignment or mask quality may be prevented.

Figure 2A:
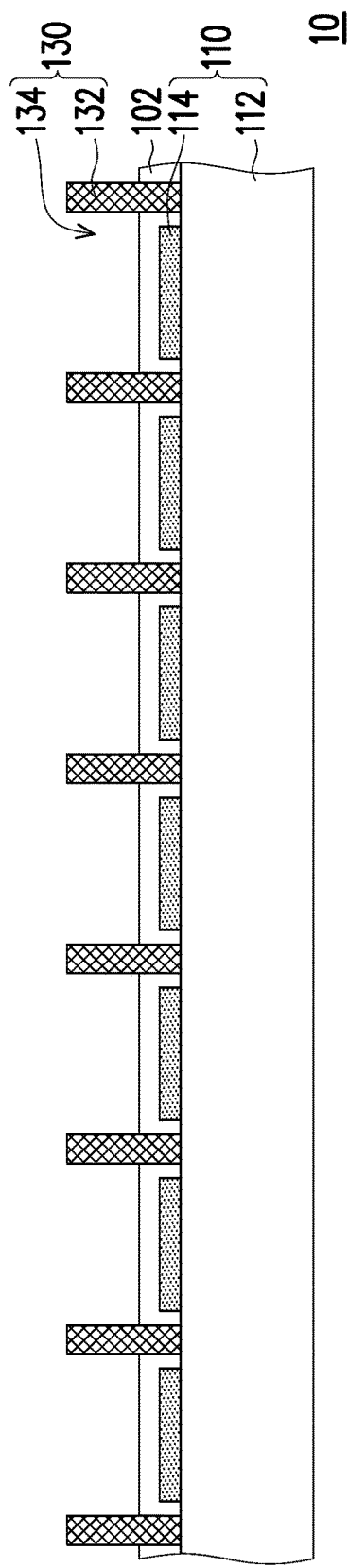
FIGS. 2A and 2B respectively illustrate an equipment for forming a microarray and a microarray formed by using the equipment according to some embodiments of the invention.
Figure 2B:
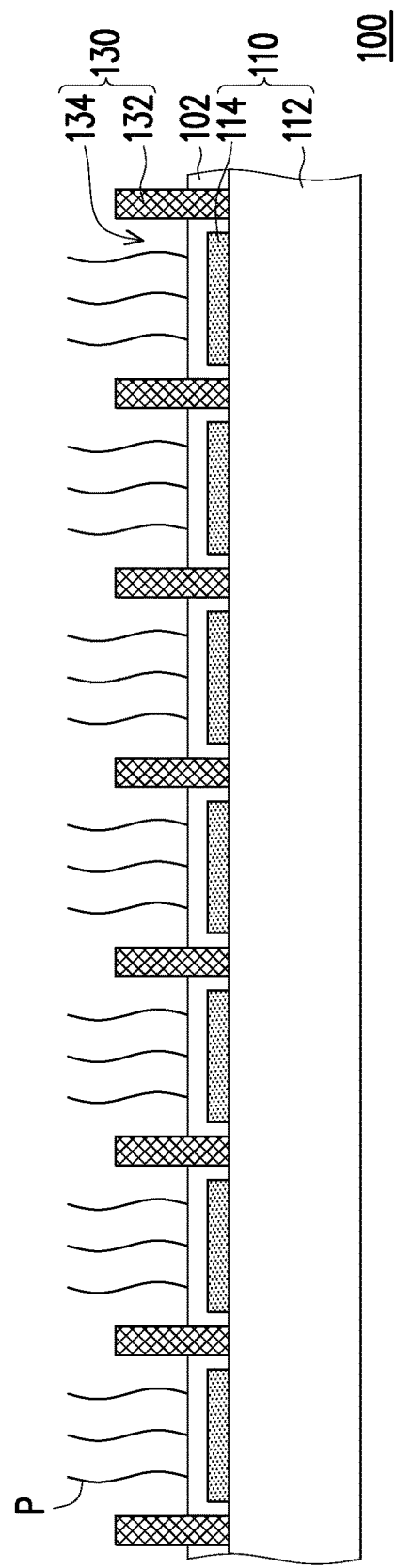

FIGS. 2A and 2B respectively illustrate an equipment for forming a microarray and a microarray formed by using the equipment according to some embodiments of the invention. The main difference between the equipment of FIG. 2A and the equipment of FIG. 1A, which is also the main difference between the formed microarray of FIG. 2B and the formed microarray of FIG. 1K, lies in a light-blocking separation. Referring to FIG. 2A, the equipment 10 further includes a light-blocking separation 130. In some embodiments, the light-blocking separation 130 is disposed between the areas 104 on the solid matrix 102. The light-blocking separation 130 may be a mesh structure, and has a body 132 and a plurality of openings 134 in the body 132 to expose the areas 104. In some embodiments, the body 132 may be directly disposed over the gaps between the LEDs 114 of the micro LED array 110, and the openings 134 may be disposed directly over the LEDs 114, and for example. In some alternative embodiments, the light-blocking separation 130 may be further disposed between the gaps between the LEDs 114.

In some embodiments, the areas 104 are physically separated by the light-blocking separation 130, and a plurality of individual spaces corresponding to the areas 104 are defined. Accordingly, during the photosynthesis for forming probes by using the equipment 10 of FIG. 2A and the forming method similar to that described in FIGS. 1B-1K, the light emitted from the LEDs 114 to irradiate the selected areas 104 may be blocked by the light-blocking separation 130, and thus the light would not irradiate the unselected areas 104 adjacent to the selected areas 104. In some embodiments, after performing several cycles of the selective irradiation step and monomer addition step, as shown in FIG. 2B, the probes P may be formed accurately in the areas 104 of the solid matrix 102 without interference, and undesired probes would not be formed in the areas 104 or the boundaries of the areas 104, so as to form a microarray 100. A material of the light-blocking separation 130 may be photoresist, metal or other suitable light-blocking material, and the light-blocking separation 130 may be formed by photolithography process, for example. A thickness of the light-blocking separation 130 may be larger than 0.1 nm, for example.

FIGS. 3A and 3B respectively illustrate an equipment for forming a microarray and a microarray formed by using the equipment according to some embodiments of the invention. The main difference between the equipment of FIG. 3A and the equipment of FIG. 1A, which is also the main difference between the formed microarray of FIG. 3B and the formed microarray of FIG. 1K, lies in that a microlens array may directly serve as a solid matrix. Referring to FIG. 3A, in the equipment 10, the solid matrix 102 includes a microlens array 140 disposed onto the micro LED array 110. The microlens array 140 includes a plurality of microlenses 142 in a plurality of areas 104, and the microlenses 142 are disposed corresponding to the LEDs 114 of the micro LED array 110. In some embodiments, a material of the microlenses 142 may be material suitable to be silanized and serving as lens, such as plastic or silicon oxide. In some embodiments, the light emitted from the LEDs 114 of the micro LED array 110 may be focused to the selected areas 104 by the microlenses 142. Accordingly, during the photosynthesis for forming probes by using the equipment 10 as shown in FIG. 3A and the forming method similar to that described in FIGS. 1B-1K, the light emitted from the LEDs 114 to irradiate the selected areas 104 may be prevented to irradiate the unselected areas 104 adjacent to the selected areas 104. In some embodiments, as shown in FIG. 3B, after performing several cycles of the selective irradiation step and monomer addition step, the probes P are directly and accurately formed on the surfaces of the microlenses 142 without interference, and undesired probes would not be formed in the areas 104 or the boundaries of the areas 104, so as to form a microarray 100.

Figure 4A:
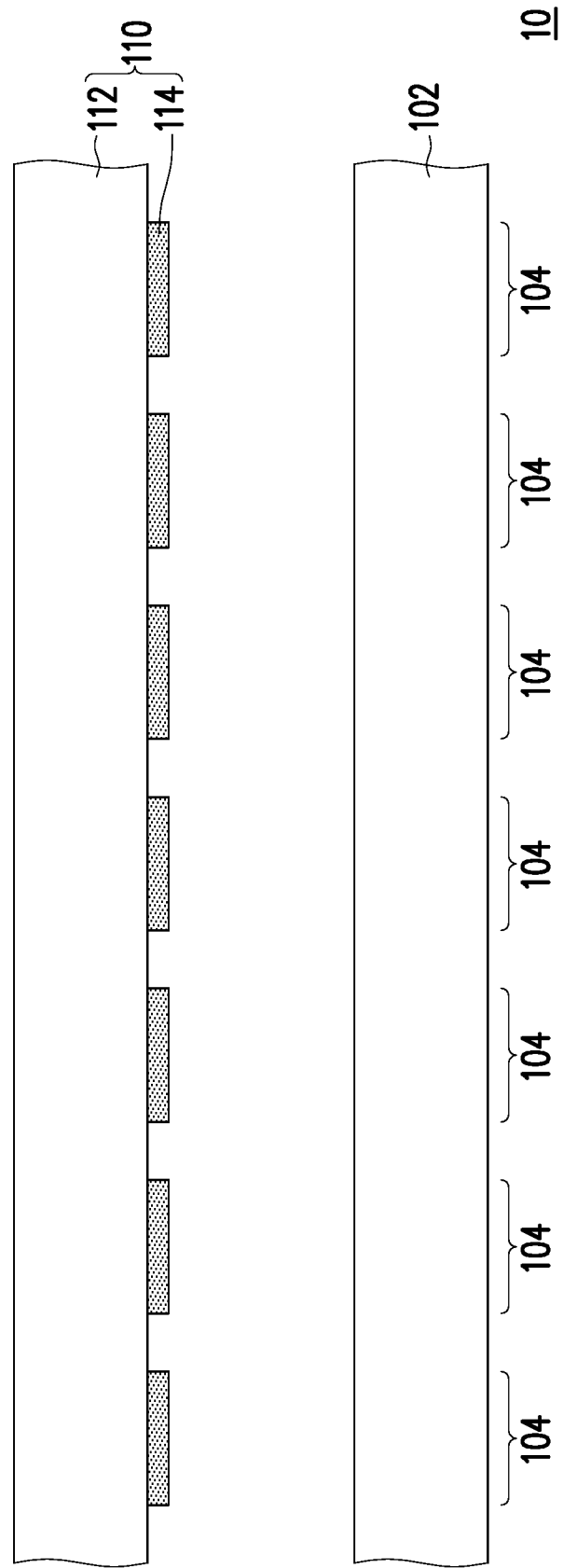
FIGS. 4A and 4B respectively illustrate an equipment for forming a microarray and a microarray formed by using the equipment according to some embodiments of the invention.
Figure 4B:
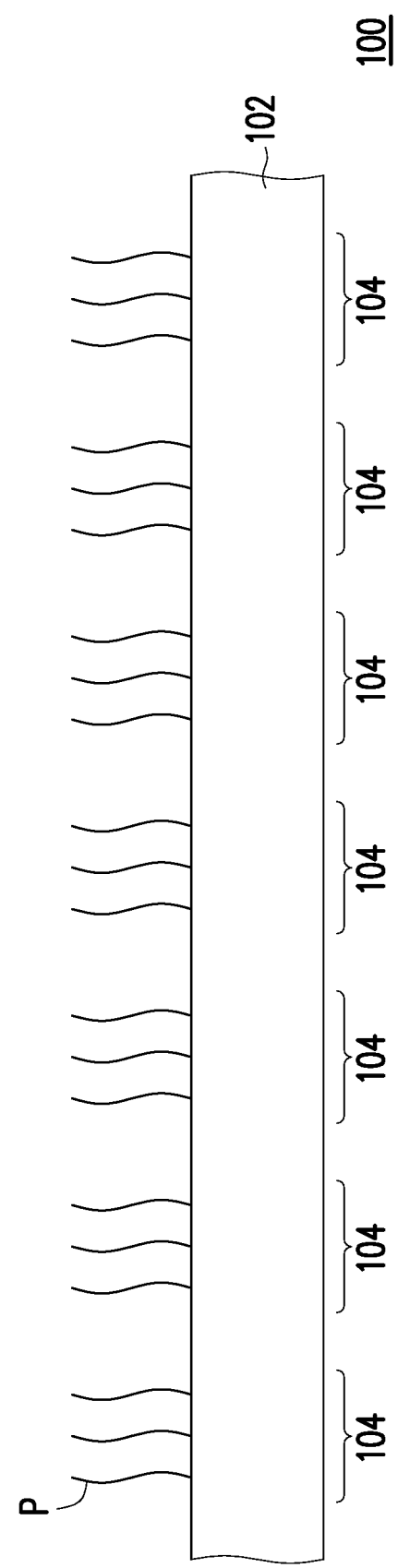

In the above equipments 10, the solid matrix 102 is disposed directly over the micro LED array 110 and light is emitted from the backsides of the solid matrix 102, however, the invention is not limited thereto. FIGS. 4A and 4B respectively illustrate an equipment for forming a microarray and a microarray formed by using the equipment according to some embodiments of the invention. The main difference between the equipment of FIG. 4A and the equipment of FIG. 1A lies in that a solid matrix and a micro LED array are separately disposed, and thus the main difference between the formed microarray of FIG. 4B and the formed microarray of FIG. 1K lies in the micro LED array is omitted. Referring to FIG. 4A, an equipment 10 includes a solid matrix 102 and a micro LED array 110. In some embodiments, the solid matrix 102 is disposed under the micro LED array 110 and separated from the micro LED array 110. In some embodiments, the solid matrix 102 is a wafer including a plurality of chips, for example. Accordingly, during the photosynthesis for forming probes by using the equipment 10 as shown in FIG. 4A and the forming method similar to that described in FIGS. 1B-1K, the light emitted from LEDs 114 directly irradiates the top surfaces of the selected areas 104 of the solid matrix 102. In some embodiments, as shown in FIG. 4B, after performing several cycles of the selective irradiation step and monomer addition step, a plurality probes P are formed in the areas 104 of the solid matrix 102, so as to form a microarray 100.

Figure 5A:
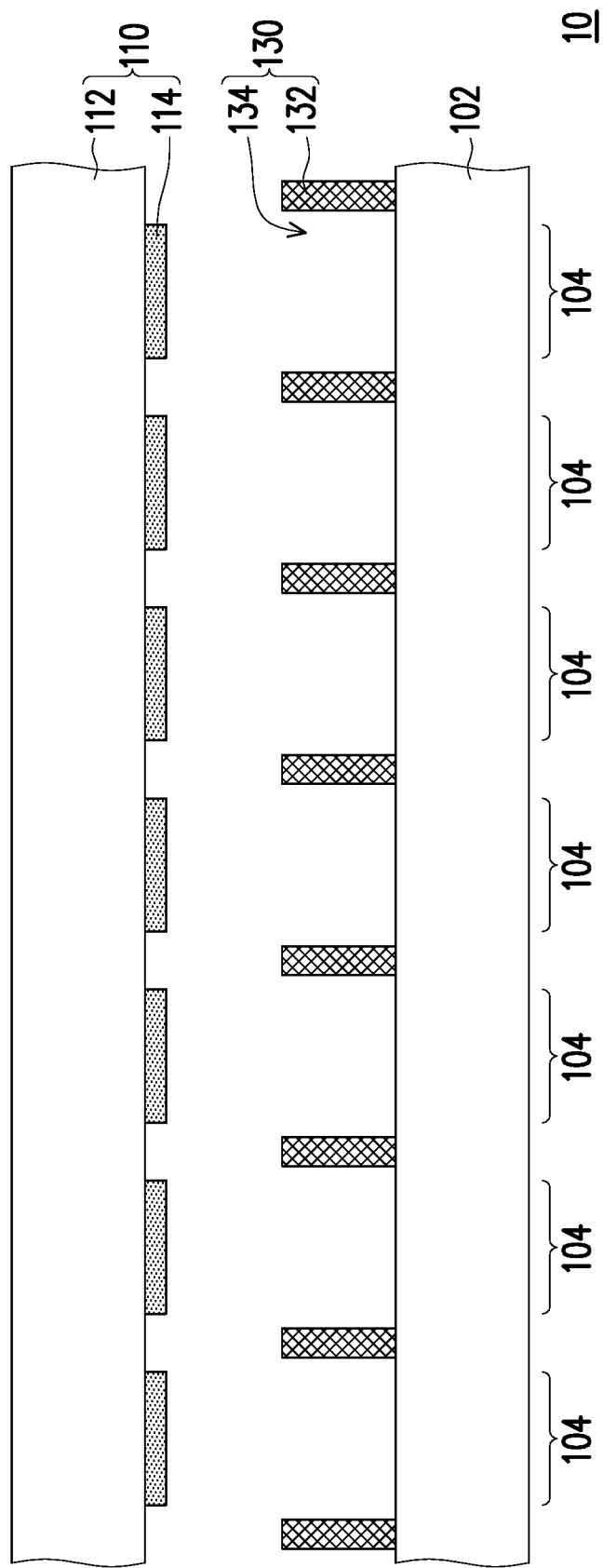
FIGS. 5A and 5B respectively illustrate an equipment for forming a microarray and a microarray formed by using the equipment according to some embodiments of the invention.
Figure 5B:
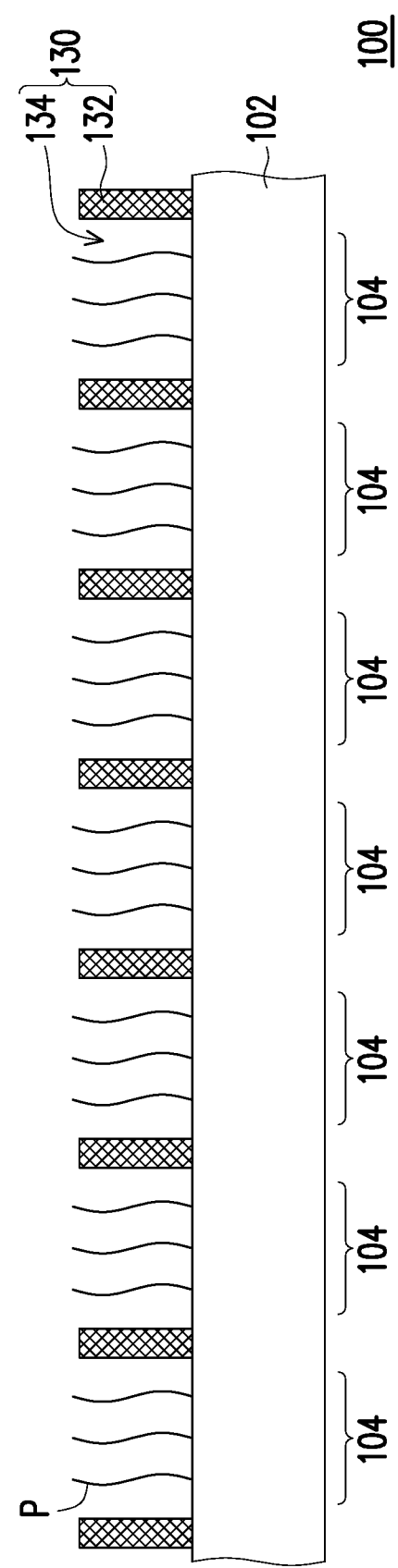

FIGS. 5A and 5B respectively illustrate an equipment for forming a microarray and a microarray formed by using the equipment according to some embodiments of the invention. The main difference between the equipment of FIG. 5A and the equipment of FIG. 4A, which is also the main difference between the formed microarray of FIG. 5B and the formed microarray of FIG. 4B, lies in a light-blocking separation. Referring to FIGS. 5A and 5B, the equipment 10/the microarray 100 may further includes a light-blocking separation 130. The light-blocking separation 130 is disposed over the solid matrix 102. The configuration, forming method, material and function of the light-blocking separation 130 are the same as or similar to those described above, and thus are omitted herein.

Figure 6:
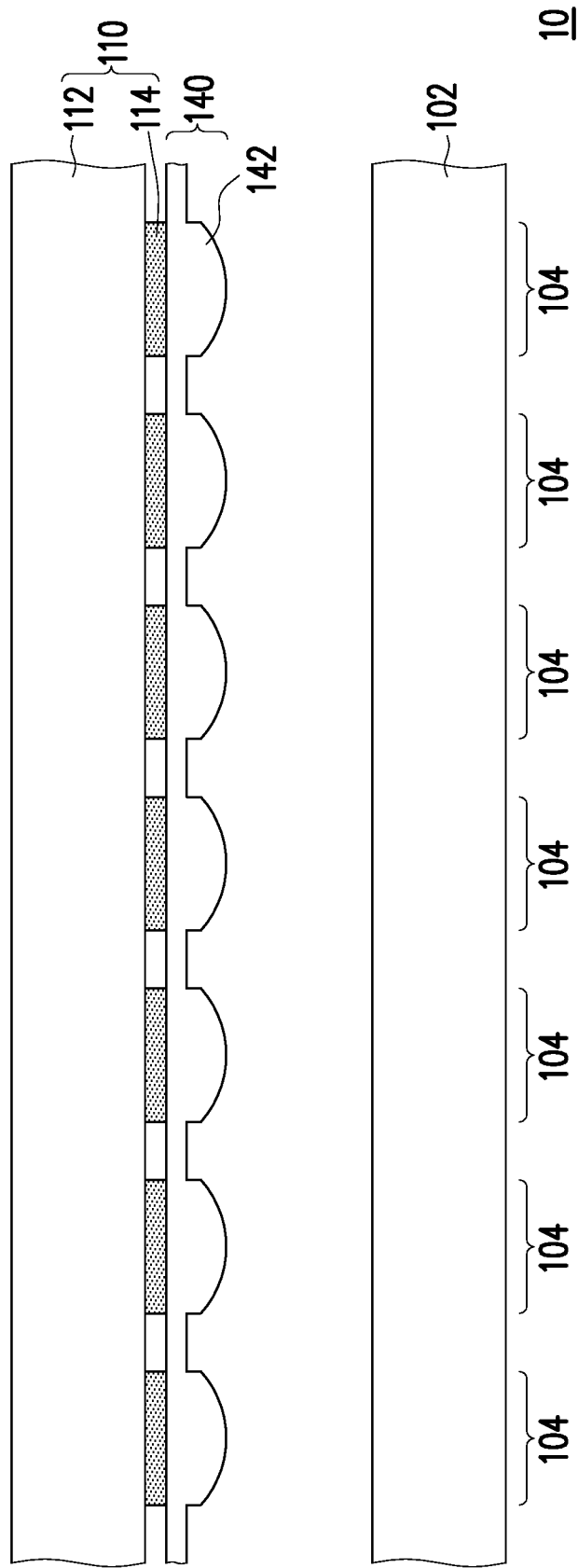
FIG. 6 illustrate an equipment for forming a microarray according to some embodiments of the invention.

FIG. 6 illustrates an equipment for forming a microarray according to some embodiments of the invention. The main difference between the equipment of FIG. 6 and the equipment of FIG. 4A lies in a microlens array. Referring to FIG. 6, the equipment 10 further includes a microlens array 140 disposed between the solid matrix 102 and the micro LED array 110. The microlens array 140 includes a plurality of microlenses 142 disposed corresponding to the the LEDs 114. In some embodiments, the light emitted from the LED 114 of the micro LED array 110 may be focused to the area 104 by the microlens 142. Accordingly, during the photosynthesis for forming probes by using the equipment 10 as shown in FIG. 6 and the forming method similar to that described in FIGS. 1B-1K, the light emitted from the LEDs 114 to irradiate the selected areas 104 may be prevented to irradiate the unselected areas 104 adjacent to the selected areas 104. In other words, after performing several cycles of the selective irradiation step and monomer addition step, a plurality of probes may be formed accurately in the areas 104 of the solid matrix 102, and undesired probes would not be formed in the areas 104 or the boundaries of the areas 104, so as to form a microarray.

Figure 7A:
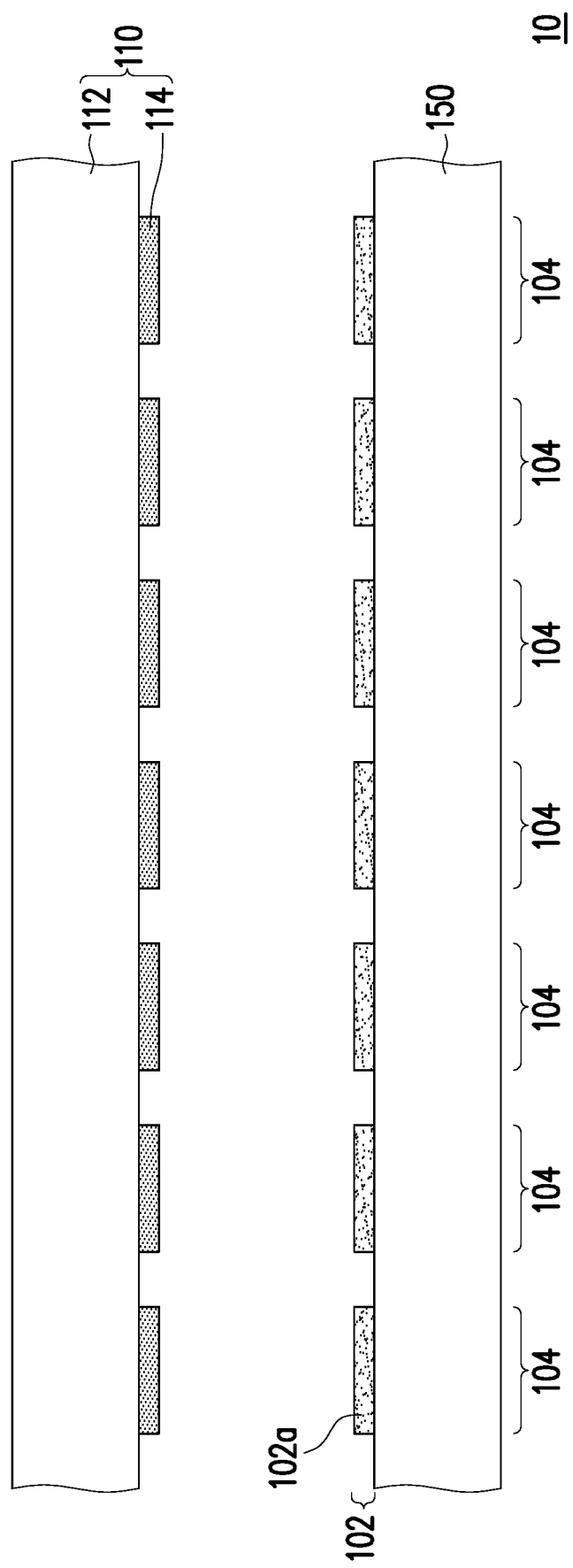
FIGS. 7A and 7B respectively illustrate an equipment for forming a microarray and a microarray formed by using the equipment according to some embodiments of the invention.
Figure 7B:
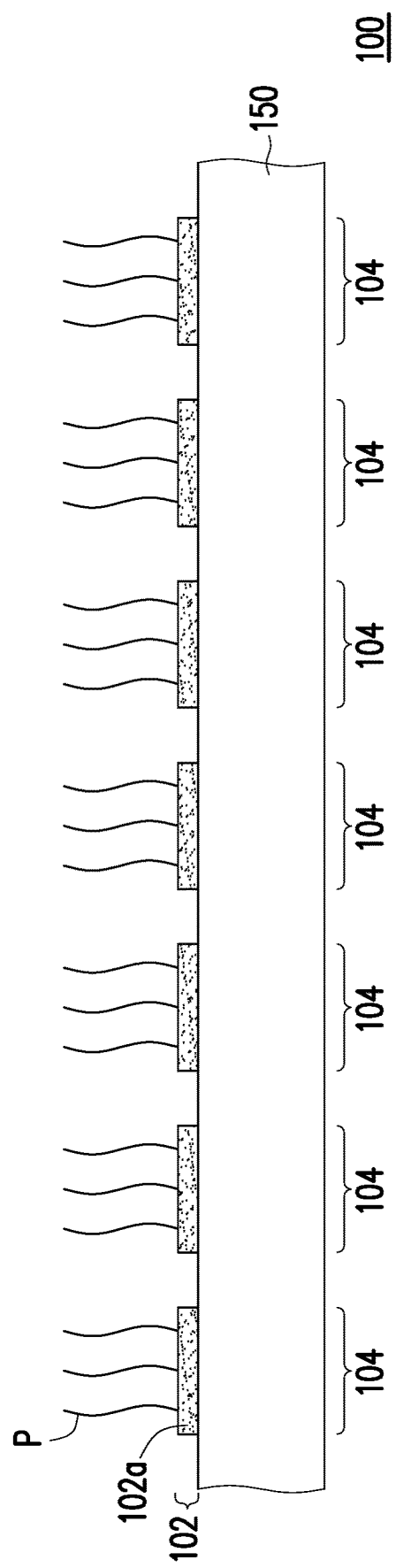

FIGS. 7A and 7B respectively illustrate an equipment for forming a microarray and a microarray formed by using the equipment according to some embodiments of the invention. The main difference between the equipment of FIG. 7A and the equipment of FIG. 4A, which is also the main difference between the formed microarray of FIG. 7A and the formed microarray of FIG. 4B, lies in that a solid matrix includes a plurality of patterns. Referring to FIGS. 7A and 7B, in the equipment 10/the microarray 100, the solid matrix 102 includes a plurality of patterns 102a respectively disposed in a plurality of areas 104. In some embodiments, the solid matrix 102 is disposed on a substrate 150. In some embodiments, compared with a surface of the substrate 150, top surfaces of the patterns 102a are more suitable for attaching the linkers. Therefore, during the photosynthesis for forming probes by using the equipment 10 as shown in FIG. 7A and the forming method similar to that described in FIGS. 1B-1K, the probes P may be merely formed on the patterns 102a, and undesired probes would not be formed on the surface of the substrate 150 between the patterns 102a. In other words, the probes P are disposed in the areas 104 respectively.

To sum up, the invention provides a method of forming probes on a solid matrix in situ by photosynthesis without using masks. The areas of the solid matrix are selectively irradiated by turning on the corresponding LEDs of the micro LED array, and thus the photolabile protecting group of the linker or monomer in the irradiated area is eliminated while the photolabile protecting group of the linker or monomer in the unirradiated area is retained. Accordingly, a coming monomer may be specifically conjugated to the deprotected linker or monomer rather than to the protected linker or monomer. Therefore, a probe with a desired monomer sequence may be formed in a desired area. Furthermore, by using the micro LED array, the masks are not required, and thus cost for forming a microarray may be significantly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a microarray, comprising:
    providing a solid matrix and a micro LED array, wherein the solid matrix comprises a plurality of areas corresponding to a plurality of LEDs of the micro LED array;
    forming a monomer with a photolabile protecting group in the plurality of areas respectively;
    irradiating at least one of the plurality of areas by turning on the corresponding LED of the micro LED array, so as to eliminate the photolabile protecting group of the monomer in the at least one of the plurality of areas;
    conjugating a monomer to the deprotected monomer in the at least one of the plurality of areas; and
    repeating the steps of irradiating and conjugating, so as to form probes in the plurality of areas respectively.

2. The method as claimed in claim 1, further comprising forming a linker between the solid matrix and the monomer with the photolabile protecting group.

3. The method as claimed in claim 1, wherein the step of forming the monomer with the photolabile protecting group in the plurality of areas respectively comprising:
    forming a linker with a photolabile protecting group in the plurality of areas respectively;
    irradiating at least one of the plurality of areas by turning on the corresponding LED of the micro LED array, so as to eliminate the photolabile protecting group of the linker in the at least one of the plurality of areas; and
    conjugating the monomer with the photolabile protecting group to the deprotected linker in the at least one of the plurality of areas.

4. The method as claimed in claim 1, wherein the steps of irradiating and conjugating comprise:
    irradiating a first set of the plurality of areas by turning on the corresponding LED of the micro LED array, so as to eliminate the photolabile protecting group of the monomer in the first set of the plurality of areas; and
    conjugating a first monomer to the deprotected monomer in the first set of the plurality of areas.

5. The method as claimed in claim 4, further comprising:
    irradiating a second set different from the first set of the plurality of areas by turning on the corresponding LED of the micro LED array, so as to eliminate the photolabile protecting group of the monomer in the second set of the plurality of areas; and
    conjugating a second monomer different from the first monomer to the deprotected monomer in the second set of the plurality of areas.

6. The method as claimed in claim 1, wherein the micro LED array is disposed above a surface of the solid matrix on which the probe is formed.

7. The method as claimed in claim 1, wherein the plurality of areas of the solid matrix are directly disposed over the plurality of LEDs of the micro LED array respectively.

8. The method as claimed in claim 1, wherein the solid matrix comprises a plurality of patterns respectively disposed in the plurality of areas.

9. The method as claimed in claim 1, wherein a surface of the solid matrix is salinized.

10. The method as claimed in claim 1, further comprising forming a light-blocking separation between the plurality of areas of the solid matrix.

11. The method as claimed in claim 1, wherein the monomer is a nucleotide or an amino acid.

12. The method as claimed in claim 1, further comprising disposing a microlens array between the solid matrix and the micro LED array, wherein the microlens array are disposed correspondingly to the plurality of areas of the solid matrix.

13. The method as claimed in claim 1, further comprising aligning the plurality of areas of the solid matrix and the plurality of LEDs of the micro LED array.

14. The method as claimed in claim 1, wherein the solid matrix is a microlens array disposed over the micro LED array.

* * * * *